(12) United States Patent
Chang

(10) Patent No.: US 7,663,439 B2
(45) Date of Patent: Feb. 16, 2010

(54) OPERATIONAL AMPLIFIER

(75) Inventor: Yaw-Guang Chang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 12/117,180

(22) Filed: May 8, 2008

(65) Prior Publication Data
US 2009/0146738 A1    Jun. 11, 2009

Related U.S. Application Data

(60) Provisional application No. 60/992,723, filed on Dec. 6, 2007.

(51) Int. Cl.
*H03F 3/45* (2006.01)
(52) U.S. Cl. ...................... 330/255; 330/257
(58) Field of Classification Search .......... 330/253, 330/255, 257
See application file for complete search history.

(56) References Cited
U.S. PATENT DOCUMENTS 6,496,175 B1 *   12/2002   Fukuo ......................... 345/99
7,126,596 B1 *   10/2006   Hogan ......................... 345/211
7,405,622 B2 *    7/2008   Nishimura et al. ........... 330/255

* cited by examiner

*Primary Examiner*—Robert Pascal
*Assistant Examiner*—Hieu P Nguyen
(74) *Attorney, Agent, or Firm*—J.C. Patents

(57) ABSTRACT

The operational amplifier adapting to a source driver is provided herein. The operational amplifier includes the input module, the first and the second current mirror module, the switch control module and output stage module, wherein the input module includes the first and the second differential pairs. The first current mirror module provides the first bias current to the first differential pairs and outputs the first mirrored current. The second current mirror module receives the second bias currents and the second mirrored current from the second differential pairs. The first and the second mirrored currents are respectively generated by mirroring the first and the second bias currents. The switch control module adjusts the first and the second bias currents for controlling the operation of the output stage module. The output stage module generates an output voltage terminal to a panel load according to the first and the second mirrored currents.

3 Claims, 3 Drawing Sheets

OPERATIONAL AMPLIFIER

CROSS-REFERENCE TO RELATED APPLICATION

This application claims the priority benefit of U.S.A. provisional application Ser. No. 60992723, filed on Dec. 6, 2007. The entirety of the above-mentioned patent application is hereby incorporated by reference herein and made a part of specification.

BACKGROUND OF THE INVENTION

1. Field of Invention

The present invention relates to an operational amplifier adapting to a source driver, and more particularly, to an operational amplifier that reduces open loop parasitic capacitor and compensate phase margin at relative less components.

2. Description of the Related Art

With great advance in the techniques of electro-optical and semiconductor devices, flat panel displays, such as liquid crystal displays (LCD), have enjoyed burgeoning development and flourished in recent year. Due to the numerous advantages of the LCD, such as low power consumption, free of radiation, and high space utilization, the LCD has become the main stream in the market. The source driver is an important element of the LCD, which converts a digital data signal used for displaying an image to an analog signal, and outputs the analog signal to each pixel of the display panel. Generally, the source driver has a plurality of driving channels transmitting the analog signal to the pixel in each data line and has a plurality of operational amplifiers for enhancing signal transmission intensity.

FIG. 1 is a circuit diagram of a conventional operational amplifier. Referring to FIG. 1, the operational amplifier 100 includes a non-inverse terminal, an inverse terminal and an output terminal denoted as the nodes A, B and C, respectively. The operational amplifier 100 is a rail-to-rail operational amplifier, which includes the P-type differential pair 110 and the N-type differential pair 120 for increasing the input voltage range that operational amplifier 100 can operate, and avoiding the differential input signal attenuating. The operational amplifier 100 also includes two current mirror circuits 130 and 140 for providing the bias currents to the differential pairs 110 and 120, wherein the P-type transistor P3 and N-type transistor N3 can be seen as current sources driving the current mirror circuits 130 and 140, and the P-type transistors P8 and P9 and N-type transistors N8 and N9 control the bias currents. Besides, the operational amplifier 100 includes the output circuit 150 for generating the output signal to the pixel on display panel.

The P-type transistors P6 and P7 included in the current mirror circuit 130 and the N-type transistors N6 and N7 included in the current mirror circuit 140 are utilized to increase the gain of the operational amplifier 110 and provide the bias currents, but these transistors will produce parasitic capacitor in the circuit of operational amplifier 100. The parasitic capacitor causes the operation of the operational amplifier 100 instable so that the capacitors C1 and C2 coupled to the output circuit 150, which are referred as Miller capacitors, are utilized for compensating the phase margin of the operational amplifier 100. Since the capacitors C1 and C2 may decrease the slew rate of the operational amplified, the bias currents of the operational amplifier 100 are increased for increasing the slew rate, but it would cause power dissipation. In addition, the capacitors C1 and C2 considerably occupy layout area of the operational amplifier 100.

SUMMARY OF THE INVENTION

The invention provides an operational amplifier that uses fewer elements to reduce the affection of parasitic capacitor, and utilizes the panel load to compensate the phase margin without the miller capacitor. Therefore, not only can reduce the layout area and cost, but also can achieve high slew rate with low bias current.

The operational amplifier adapting to a source driver is provided in the present invention. The operational amplifier includes an input module, the first and second current mirror modules, a switch control module and an output stage module. The input module has a first input terminal and a second input terminal respectively receiving a first signal and a second signal. The input module includes a first differential pair and a second differential pair. The first current mirror module has both of a first node and a second node coupled to the first differential pair. The first current mirror module provides a first bias current to the first differential pair via the first node and outputs a first mirrored current via the second node. The first mirrored current is generated by mirroring the first bias current. The second current mirror module has both of a third node and a fourth node coupled to the second differential pair. The second current mirror module receives a second bias current from the second differential pair via a third node and receives a second mirrored current via the fourth node. The second mirrored current is generated by mirroring the second bias current.

In addition, the switch control module is coupled to both of the first node and the second node of the first current mirror module and is coupled to both of the third node and the fourth node of the second current mirror module. The switch control module adjusts the first bias current and the second bias current and thereby adjusts the first and the second mirrored currents. The output stage module is used for generating an output voltage signal via an output terminal thereof to a panel load according to the first mirrored current and the second mirrored current. The output stage module includes a first transistor and a second transistor, wherein the conductivities of the first and the second transistors are respectively controlled by the first and the second mirrored currents. A gate and a first source/drain of the first transistor are respectively coupled to the second node of the first current mirror module and a first voltage, and a second source/drain of the first transistor generates the said output voltage signal. A gate, a first source/drain and a second source/drain of the second transistor are respectively coupled to the fourth node of the second current mirror module, the second source/drain of the first transistor and a second voltage.

In the foregoing operational amplifier, the first current mirror module includes a ninth transistor and a tenth transistor. The ninth transistor has a gate, a first source/drain and a second source/drain. The first source/drain of the ninth transistor is coupled to the first voltage, and the gate of the ninth transistor is coupled to the second source/drain thereof, wherein the second source/drain of the ninth transistor is served as the first node of the first current mirror module. The tenth transistor has a gate and a first source/drain respectively coupled to the gate of the ninth transistor and the first voltage and has a second source/drain served as the second node of the first current mirror module.

In the foregoing operational amplifier, the second current mirror module includes an eleventh transistor and a twelfth transistor. The eleventh transistor has a gate, a first source/drain and a second source/drain. The gate of the eleventh transistor is coupled to the first source/drain thereof, and the second source/drain of the eleventh transistor is coupled to the second voltage, wherein the first source/drain of eleventh transistor is served as the third node of the second current mirror module. The twelfth transistor has a first source/drain served as the fourth node of the second current mirror module and has a gate and a second source/drain respectively coupled to the gate of the eleventh transistor and the second voltage.

The present invention provides an operational amplifier that utilizes the panel load to compensate the phase margin since the panel load is equivalent to a RC series circuit. Hence, the additional Miller capacitors in the prior art are not needed so that the layout area and cost can be reduced, and the operational amplifier can obtain high slew rate at relatively low bias currents for saving power.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 2:
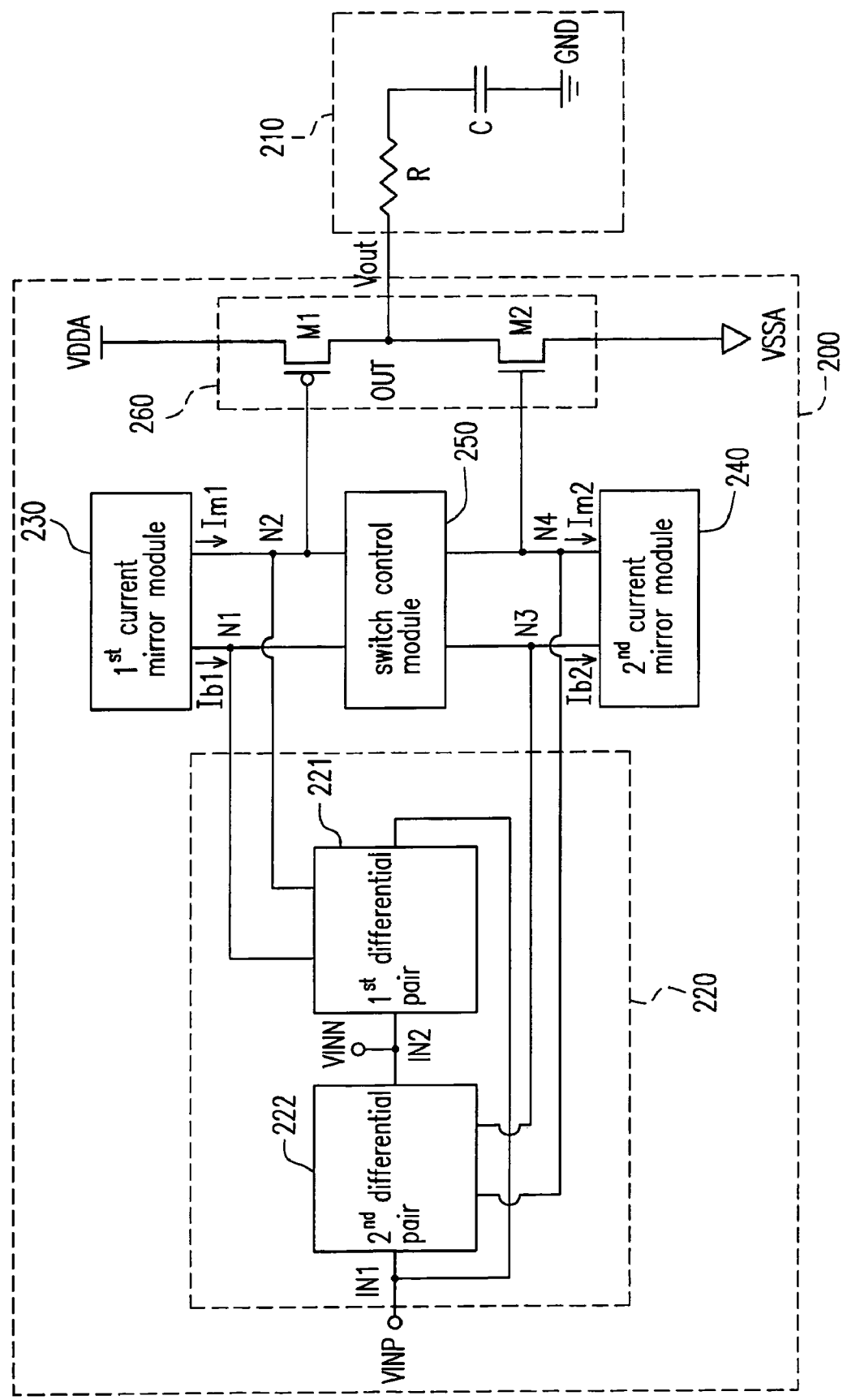
FIG. 2 is a block diagram of an operational amplifier according to an embodiment of the present invention.

FIG. 2 is a block diagram of an operational amplifier according to an embodiment of the present invention. Referring to FIG. 2, the operational amplifier 200 is applied to a source driver for enhancing the output driving ability of the source driver and the signal transmission intensity. The operational amplifier 200 is coupled to a panel load 210, which the panel load 210 is equivalent to a RC series circuit. The operational amplifier 200 includes an input module 220, a first current mirror module 230, a second current mirror module 240, a switch control module 250 and an output stage module 260. The input module 220 includes a first differential pair 221 and a second differential pair 222. It is assumed that the first and the second differential pairs 221 and 222 are respectively the N-type and P-type differential pairs for increasing the input voltage range of the operational amplifier 200 since the polarity inversion is often employed in driving the display device and the complementary pixel voltages, i.e. positive polarity voltage and negative polarity voltage, are alternately provided to the pixel electrode. The input module 220 has a first input terminal IN1 and a second input terminal IN2 respectively served as a non-inverse terminal and an inverse terminal of the operational amplifier 200 and respectively receiving a first signal VINP and a second signal VINN.

The first current mirror module 230 has a node N1 and a node N2 respectively coupled to the first differential pair 221. The first current mirror module 230 provides a bias current Ib1 to the first differential pair 221 via the node N1 and generates a mirrored current Im1 by mirroring the bias current Ib1. The first current mirror module 230 outputs the mirrored current Im1 via the node N2. The second current mirror module 240 has a node N3 and a node N4 respectively coupled to the second differential pair 222. The second current mirror module 240 receives a bias current Ib2 from the second differential pair 222 via the node N3 and receives a mirrored current Im2, which is generated by mirroring the bias current Ib2, via the node N4. The switch control module 250 is coupled to the nodes N1 and N2 of the first current mirror module 230 and the nodes N3 and N4 of the second current mirror module 240. The switch control module 250 adjusts the bias current Ib1 provided to the first differential pair 221 and adjusts the bias current Ib2 received from the second differential pair 222 for controlling the operation of the output stage module 260.

The output stage module 260 includes the transistors M1 and M2, wherein the transistors M1 and M2 are respectively PMOS transistor and NMOS transistor in the embodiment. A gate of the transistor M1 is coupled to the node N2 of the first current mirror module 230, a first source/drain of the transistor M1 is coupled to the power supply voltage VDDA, e.g. 5 volt, and a second source/drain of the transistor M1 generates the output voltage signal Vout. A gate of the transistor M2 is coupled to the node N4 of the second current mirror module 240, a first source/drain of the transistor M2 is coupled to the first source/drain of the transistor M1, and a second source/drain of the transistor M2 is coupled to the ground voltage VSSA, e.g. 0 volt. Since the mirrored currents Im1 and Im2 are respectively generated by mirroring the bias currents Ib1 and Ib2, the mirror currents Im1 and Im2 can be adjusted by the operation of the switch control module 250, and thereby change the voltages of the gate of the transistor M1 and the gate of the transistor M2 for controlling the conductivities of the transistors M1 and M2. Therefore, the output stage module 260 generates the output voltage signal Vout via an output terminal OUT to the panel load 210 according to the mirrored currents Im1 and Im2. The output terminal OUT is served as an output terminal of the operational amplifier 200. If the operational amplifier 200 is a unity gain operational amplifier, the output terminal OUT of the output stage module 260 is coupled to the second input terminal IN2 of the input module 220.

In the said embodiment, the operational amplifier 200 is applied to the source driver, and the panel load 210 coupled to the operational amplifier 200 can be utilized to compensate the phase margin of the operational amplifier 200 so that the Miller capacitor is not needed in the said embodiment as compared with prior art. As known, the Miller capacitor having high capacitance may decrease the slew rate of the operational amplifier so that the bias currents should be increased for maintaining the slew rate, but the power consumption is increased. In addition, the Miller capacitor occupies the layout area. Therefore, the operational amplifier 200 of the said embodiment not only can reduce the layout area and cost, but also can obtain high slew rate at relatively low bias currents.

Figure 3:
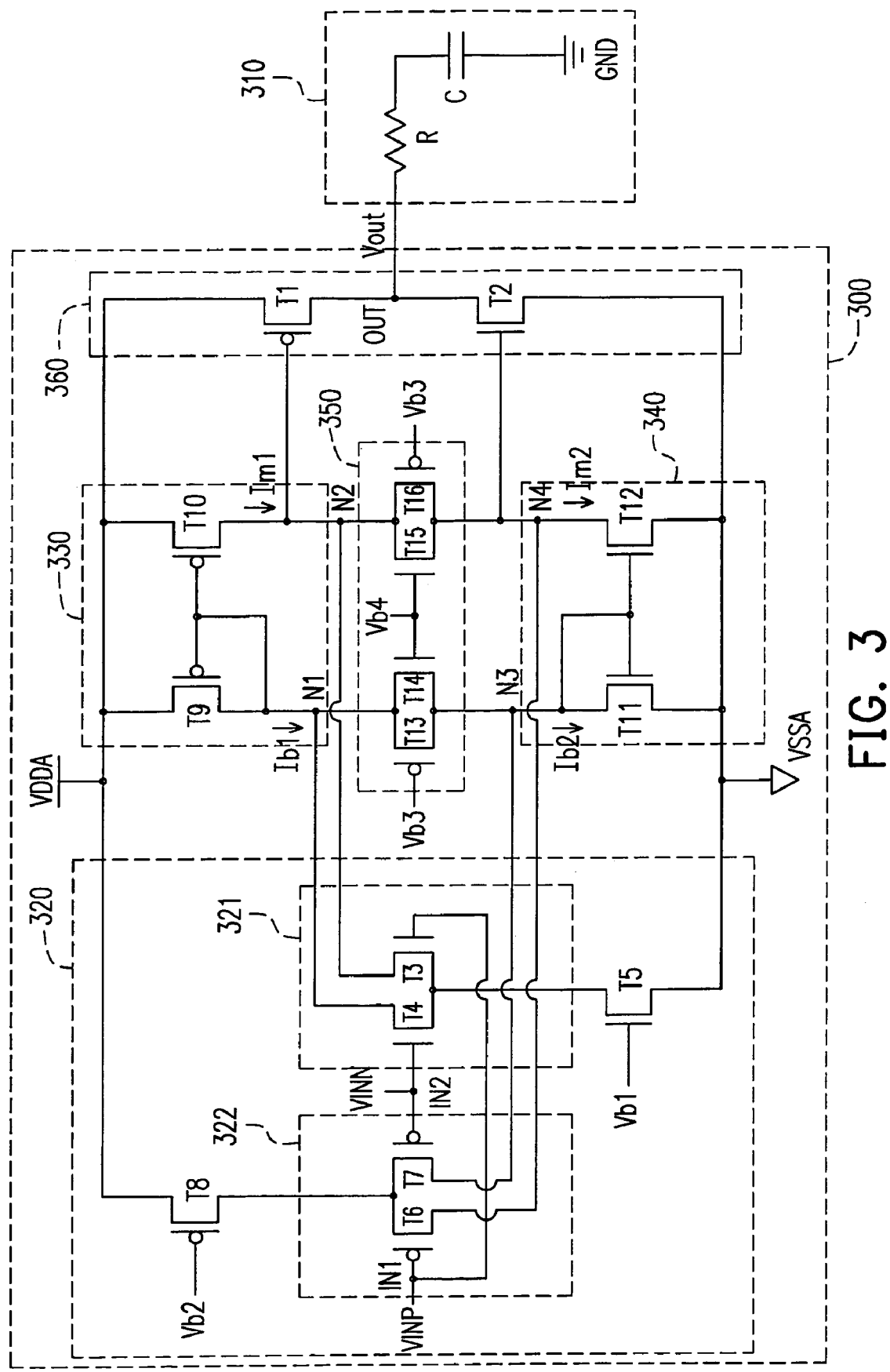
FIG. 3 is a circuit diagram of an operational amplifier according to an embodiment of the present invention.

In order to make people ordinary skilled in the art easily practice the present invention, there is another embodiment described herein. FIG. 3 is a circuit diagram of the operational amplifier according to an embodiment of the present invention. Referring FIG. 3, the operational amplifier 300 includes an input module 320, a first current mirror module 330, a second current mirror module 340, a switch control module 350 and an output stage module 360. For convenience of description, the signs of signal, terminal, node, current, and voltage are quoted from the embodiment in FIG. 2. The operational amplifier 300 is applied to a source driver for transmitting the output voltage signal Vout to the panel load 310. The input module 320 includes an N-type differential pair 321, a P-type differential pair 322 and the transistor T5 and T8. The transistors T5 and T8 operate as current sources for driving the first current mirror module 330 and the second current mirror module 340 respectively. The N-type differential pair 321 includes the transistors T3 and T4, and the P-type differential pair 321 includes the transistors T6 and T7, wherein the transistors T3 through T5 are NMOS transistors and the transistors T6 through T8 are PMOS transistors in the embodiment.

In the N-type differential pair 321, a first source/drain and a second source/drain of the transistor T3 are respectively coupled to the node N2 of the first current mirror module 330 and a first source/drain of the transistor T5, and a gate of the transistor T3 receives the first signal VINP, while a gate and a second source/drain of the transistor T5 are respectively coupled to a bias voltage Vb1 and the ground voltage VSSA. A first source/drain and a second source/drain of the transistor T4 are respectively coupled to the node N1 of the first current mirror module 330 and the second source/drain of the transistor T3, and a gate of the transistor T4 receives the second signal VINN. In the P-type differential pair 322, a first source/drain and a second source/drain of the transistor T6 are respectively coupled to a second source/drain of the transistor T8 and the node N4 of the second current mirror module 340, and a gate of the transistor T6 receives the first signal VINP, while a gate and a first source/drain of the transistor T8 are respectively coupled to a bias voltage Vb2 and the power supply voltage VDDA. A first source/drain and a second source/drain of the transistor T7 are respectively coupled to the first source/drain of the transistor T6 and the node N3 of the second current mirror module 340, and a gate of the transistor T7 receives the second signal VINN. The P-type and N-type differential pairs are coupled in the form of rail-to-rail for increasing the input voltage range of the operational amplifier 300.

The first current mirror module 330 includes the transistors T9 and T10, wherein the transistors T9 and T10 are PMOS transistors in the embodiment. The transistor T9 has a first source/drain coupled to the power supply voltage VDDA, a second source/drain served as the node N1 of the first current mirror module 330, and a gate coupled to the second source/drain thereof. The transistor T10 has a gate coupled to the gate of the transistor T9, a first source/drain coupled to the power supply voltage VDDA, and a second source/drain served as the node N2 of the first current mirror module 330. The first current mirror module 330 provides the bias current Ib1 to the N-type differential pair 321 via the node N1 and outputs the mirrored current Im1 to the output stage module 360 via the node N2. The mirrored current Im1 is generated by mirroring the bias current Ib1.

The second current mirror module 340 includes the transistors T11 and T12, wherein the transistors T11 and T12 are NMOS transistors in the embodiment. The transistor T11 has a first source/drain served as the node N3 of the second current mirror module 340, a second source/drain coupled to the ground voltage VSSA, and a gate coupled to the first source/drain thereof. The transistor T12 has a gate coupled to the gate of the transistor T11, a first source/drain served as node N4 of the second current mirror module 340, and a second source/drain coupled to the ground voltage VSSA. The second current mirror module 340 receives the bias current Ib2 from the P-type differential pair 322 via the node N3 and receives the mirrored current Im2 via the node N4. The mirrored current Im2 is generated by mirroring the bias current Ib2.

The switch control module 350 includes the transistor T13 through T16, wherein the transistor T13 and T16 are PMOS transistors and the transistors T14 and T15 are NMOS transistors in the embodiment. A gate, a first source/drain, and a second source/drain of the transistor T13 are respectively coupled to a bias voltage Vb3, the node N1 of the first current mirror module 330, and the node N3 of the second current mirror module 340. A gate, a first source/drain, and a second source/drain of the transistor T14 are respectively coupled to a bias voltage Vb4, the first source/drain of the transistor T13, and the second source/drain of the transistor T13. A gate, a first source/drain, and a second source/drain of the transistor T15 are respectively coupled to the bias voltage Vb4, the node N2 of the first current mirror module 330, and the node N4 of the second current mirror module 340. A gate, a first source/drain, and a second source/drain of the transistor T16 are respectively coupled to the bias voltage Vb3, the first source/drain of the transistor T15 and the second source/drain of the transistor T15.

The conducting states of the transistors T13 through T16 can control the bias currents Ib1 and Ib2 provided to the N-type differential pair 321 and the P-type differential pair 322 and then control the mirrored currents Im1 and Im2 provided to the output stage module 360. Hence, the output stage module 360 generates the output voltage signal Vout to the panel load 310 according to the mirrored currents Im1 and Im2.

Figure 1:
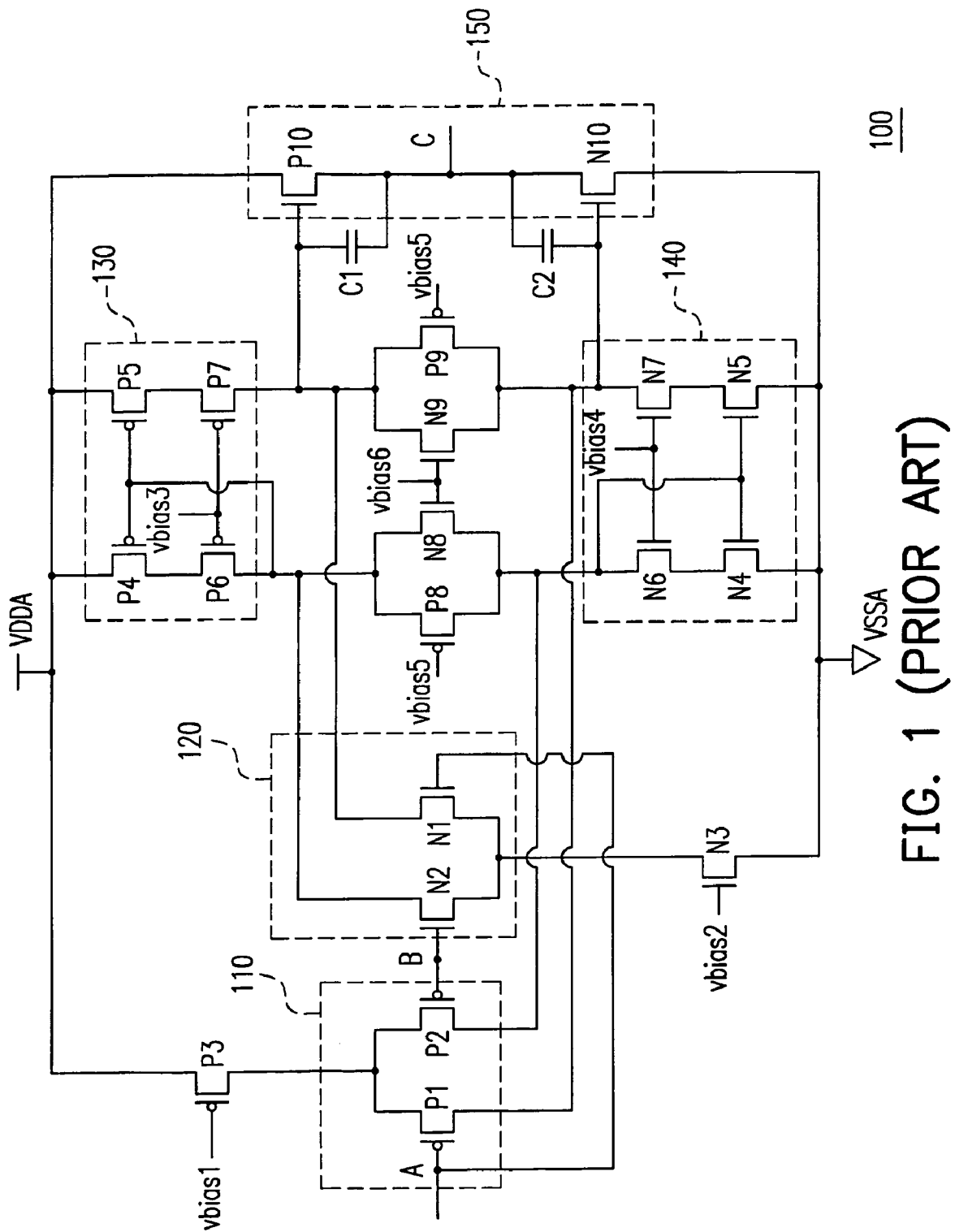
FIG. 1 is a circuit diagram of a conventional operational amplifier.

In the embodiment, there is no needs of cascade transistors in the first current mirror module 330 and 340, such as the transistors P6 and P7 and the transistors N6 and N7 of FIG. 1, to increase the gain of the operational amplifier 300 since the driving ability of the operational amplifier 300 is sufficient to common display device. Therefore, the said embodiment reduces the affection of parasitic capacitor in the circuit of the operational amplifier 300, and ensures the operational amplifier 300 operating correctly. Besides, the said embodiment utilize the panel load, which is equivalent to RC series circuit, to compensate the phase margin of the operational amplifier 300 without the Miller capacitor and make the operational amplifier 300 operate stably. The operational amplifier 300 which has no needs of Miller capacitor can reduce t the layout area and cost are reduced, and obtain high slew rate at relatively low bias currents so as to save power.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An operational amplifier, adapted for a source driver, the operational amplifier comprising:
    an input module, having a first input terminal receiving a first signal, and a second input terminal receiving a second signal, wherein the input module comprises a first differential pair and a second differential pair;
    a first current mirror module, having a first node and a second node coupled to the first differential pair for providing a first bias current to the first differential pair via the first node and outputting a first mirrored current via the second node wherein the first mirrored current is generated by mirroring the first bias current;
    a second current mirror module having a third node and a fourth node coupled to the second differential pair for receiving a second bias current from the second differential pair via the third node and receiving a second mirrored current via the fourth node, wherein the second mirrored current is generated by mirroring the second bias current;

a switch control module, coupled to the first node and the second node of the first current mirror module and coupled to the third node and the fourth node of the second current mirror module for adjusting the first bias current and the second bias current; and an output stage module, having an output terminal generating an output voltage signal to a panel load according to the first mirrored current and the second mirrored current, and comprising:

a first transistor, having a gate coupled to the second node of the first current mirror module, a first source/drain coupled to a first voltage and a second source/drain generating the output voltage signal; and a second transistor, having a gate coupled to the fourth node of the second current mirror module, a first source/drain coupled to the second source/drain of the first transistor, and a second source/drain coupled to a second voltage, wherein the switch control module respectively adjusts the first bias current and the second bias current for controlling the conductivities of the first transistor and the second transistor in the output stage module;

the first differential pair comprises:

a third transistor, having a gate receiving the first signal, a first source/drain coupled to the second node of the first current mirror module, and a second source/drain coupled to the second voltage; and a fourth transistor, having a gate receiving the second signal, a first source/drain coupled to the first node of the first current mirror module, and a second source/drain coupled to the second source/drain of the third transistor;

the input module further comprises:

a fifth transistor, having a gate coupled to a first bias voltage, a first source/drain coupled to the second source/drain of the third transistor, and a second source/drain coupled to the second voltage;

the second differential pair comprises:

a sixth transistor, having a gate receiving the first signal, a first source/drain coupled to the first voltage, and a second source/drain coupled to the fourth node of the second current mirror module; and a seventh transistor, having a gate receiving the second signal, a first source/drain coupled to the first source/drain of the sixth transistor, and a second source/drain coupled to the third node of the second current mirror module;

the input module further comprises:

an eighth transistor, having a gate coupled to a second bias voltage, a first source/drain coupled to the first voltage, and a second source/drain coupled to the first source/drain of sixth transistor;

the first current mirror module comprises:

a ninth transistor, having a gate, a first source/drain coupled to the first voltage, and a second source/drain coupled to the gate thereof, wherein the second source/drain of the ninth transistor serves as the first node of the first current mirror module; and a tenth transistor, having a gate coupled to the gate of the ninth transistor, a first source/drain coupled to the first voltage, and a second source source/drain serving as the second node of the first current mirror module;

the second current mirror module comprises:

an eleventh transistor, having a gate, a first source/drain coupled to the gate thereof, and a second source/drain coupled to the second voltage, wherein the first source/drain of the eleventh transistor serves as the third node of the second current mirror module; and a twelfth transistor, having a gate coupled to the gate of the eleventh transistor, a first source/drain serving as the fourth node of the second current mirror module, and a second source/drain coupled to the second voltage; and the switch control module comprises:

a thirteenth transistor, having a gate coupled to a third bias voltage, a first source/drain coupled to the first node of the first current mirror module, and a second source/drain coupled to the third node of the second mirror module;

a fourteenth transistor, having a gate coupled to a fourth bias voltage, a first source/drain coupled to the first source/drain of the thirteenth transistor, and a second source/drain coupled to the second source/drain of the thirteenth transistor;

a fifteenth transistor, having a gate coupled to the fourth bias voltage, a first source/drain coupled to the second node of the first current mirror module, and a second source/drain coupled to the fourth node of the second current mirror module; and a sixteenth transistor, having a gate coupled to the third bias voltage, a first source/drain coupled to the first source/drain of the fifteenth transistor, and a second source/drain coupled to the second source/drain of the fifteenth transistor.

2. The operational amplifier as claimed in claim 1, wherein the operational amplifier is an unity gain operational amplifier, and the output terminal of the output stage module is coupled to the second input terminal of the input module.

3. The operational amplifier as claimed in claim 1, wherein the first voltage is a power supply voltage, and the second voltage is a ground voltage.

* * * * *